United States Patent [19]

Yamazaki

[11] Patent Number: 5,037,514
[45] Date of Patent: Aug. 6, 1991

[54] SILICON OXIDE DEPOSITING METHOD

[75] Inventor: Shunpei Yamazaki, Tokyo, Japan

[73] Assignee: Semiconductor Energy Laboratory Co., Ltd., Atsugi, Japan

[21] Appl. No.: 462,324

[22] Filed: Dec. 28, 1989

Related U.S. Application Data

[63] Continuation of Ser. No. 352,645, May 12, 1989, abandoned, which is a continuation of Ser. No. 170,107, Mar. 14, 1988, abandoned, which is a continuation of Ser. No. 850, Jan. 6, 1987, abandoned.

[30] Foreign Application Priority Data

Jan. 6, 1986 [JP] Japan .................................... 61-1003
Jan. 6, 1986 [JP] Japan .................................... 61-1004
Jan. 6, 1986 [JP] Japan .................................... 61-1005

[51] Int. Cl.$^5$ ............................................. C23C 16/24
[52] U.S. Cl. ................................ 204/157.45; 427/51; 427/53.1; 427/54.1; 427/55; 427/255; 427/255.3; 437/238
[58] Field of Search ................. 204/157.45; 427/50, 427/51, 53.1, 54.1, 55, 255, 255.3; 437/238

[56] References Cited

U.S. PATENT DOCUMENTS

| 3,490,961 | 1/1970 | Frieser et al. | 204/157.45 |
| 4,239,811 | 12/1980 | Kemlage | 427/95 |
| 4,371,587 | 2/1983 | Peters | 204/157.45 |
| 4,539,221 | 9/1985 | Jacob et al. | 427/53.1 |
| 4,631,199 | 12/1986 | Hall et al. | 427/54.1 |
| 4,683,147 | 7/1987 | Eguchi | 427/54.1 |
| 4,759,947 | 7/1988 | Ishihara | 427/53.1 |

FOREIGN PATENT DOCUMENTS 60-239338 11/1985 Japan .

OTHER PUBLICATIONS

Bell et al., "Calculation of Heats of Formation and Dissociation of Methyl- and Chloro-Substituted Disilanes", J. Phys. Chem., vol. 86, pp. 3922-3925 (1982).

Primary Examiner—T. Tung
Assistant Examiner—David G. Ryser
Attorney, Agent, or Firm—Sixbey, Friedman, Leedom & Ferguson

[57] ABSTRACT

An improved method for forming a silicon oxide layer is shown. In the method, $Si_2Cl_6$ is used as silicon oxide gas of the process gas. The silicon oxide layer is formed with a very low density of natural oxide which has been removed by free chlorine atoms, a byproduct of the process.

9 Claims, 2 Drawing Sheets

SILICON OXIDE DEPOSITING METHOD

This application is a continuation of Ser. No. 07/352,645, filed May 12, 1989, now abandoned, which itself was a continuation of application Ser. No. 07/170,107, filed Mar. 14, 1988, now abandoned, which itself was a continuation of Application Ser. No. 000,850, filed Jan. 6, 1987, now abandoned.

BACKGROUND OF THE INVENTION

The present invention relates to silicon oxide layer depositing methods.

In prior art, a silicon oxide film has been fabricated by plasma enhanced CVD by means of a glow discharge system in which a chemical reaction between silan and nitrogen oxide goes on at a substrate temperature of 200° to 400° C.

However, in silicon oxide films natural oxides are not removed and hydrogen resides at 10 atom %, so that the films is provided only with poor heat resistance.

Further, in such a silicon oxide layer remains residual charges due to residual dangling bonds and clusters of silicon. And because of these charges, it can not used as a gate insulating layer for MOS' and other integrated circuits. According to the prior art, hydrogen and OH- remain in the silicon oxide thus formed.

For instance, in case of a channel region of an insulated gate FET, Si—H bonds are easily cut by charges which are attracted by concentrated electric field on the gate-to-semiconductor interface. Thence dangling bonds resulting from the disconnected bond immediately constitute interface levels and therefore the device is significantly degraded.

Therefore, it has been demanded to fabricate in practice silicon oxide layers from gaseous silicon oxide which tends not to produce dangling bonds of silicon.

SUMMARY OF THE INVENTION

It is therefore an object of the invention is to provide an improved fabrication method for silicon oxide layer.

It is another object of the invention is to provide an fabrication method for silicon oxide layer of which natural oxide density is significantly reduced.

It is further object of the invention is provide a method capable of fabricating silicon oxide layer at a low temperature.

BRIEF DESCRIPTION OF THE INVENTION

FIG. 1 is a sectional view showing a further embodiment of the invention.

DETAILED DESCRIPTION OF THE PREFERRED EMBODIMENTS

In order to avoid the above problems of prior art, the inventor discloses here the use of hexachloro-disilan.

Hexachloro-disilan is capable of being directly discomposed in response to irradiation of light with wave length of 184 nm and 254 nm, particularly of 184 nm. The inventor explains the decomposition by the chemical equations;

$$Si_2Cl_6 \rightarrow Si + SiCl_4 + Cl_2$$

or $$Si_2Cl_6 + 3H_2 \rightarrow 2Si + 6HCl$$

By virtue of this reaction, it is possible to grow a monocrystalline semiconductor layer on a substrate at 200° to 600° C. And impurity on the surface of the substrate, such as natural oxide, can be removed by free chlorine atoms, reducing defects on the semiconductor.

The semiconductor layer according to the invention incorporates bonds, Si—Cl or Si—Cl....H but is very scant of hydrogen, compared with prior art layer which has been formed by using $SiH_4$.

In the following are characteristics of $Si_2Cl_6$:
Appearance; transparent and irritating odoriferous at a room temperature,
Melting Point; −1° C.
Boiling Point; +144° C.
Heat of Evaporation; 42 KJ/mol
Heat of Generation at 25° C.; 986.5 KJ/mol
The above description can be repeated with $Si_3Cl_8$, represented by $Si_nCl_{2n+2}(n \geq 2)$ in general, in place of $Si_2Cl_6$.

Figure 1:
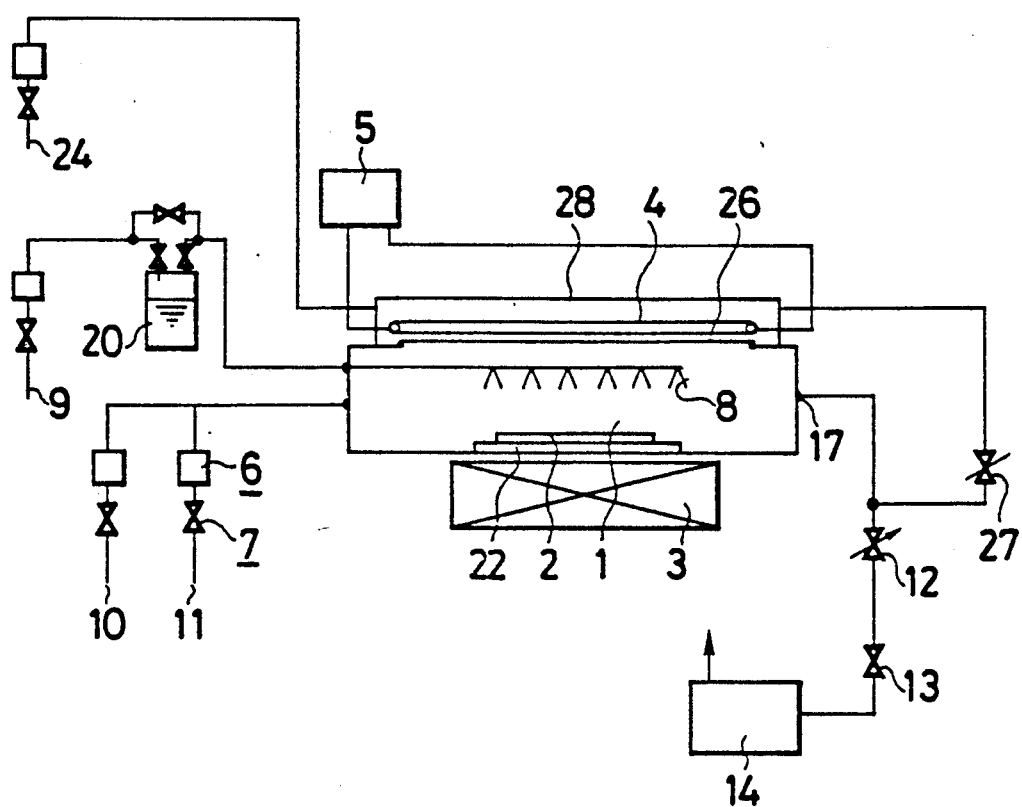
FIG. 1 is a sectional view showing an embodiment of the invention.

Referring to FIG. 1, a photo CVD system or a thermal CVD system according to the invention is illustrated.

In the Figure, a reaction chamber or vacuum chamber 1 is made of quartz. On a holder 22 which is heated from the bottom by a heater 3, a substrate 2 is mounted and heated at the room temperature to 900° C., preferably at the room temperature to 500° C., for example at 300° C. A doping system comprises flow meters 6, a bubbler 20 and valves 7, to which nitrogen oxide and nitrogen are supplied via lines 9 and 10 respectively. The bubbler 20 is filled with $Si_2Cl_6$, whose melting point is −1° C. and whose boiling point is 144° C. The silicon which is diluted with nitrogen gas is leaked from shower nozzles 8 toward the upper surface of the substrate 2, so that a silicon oxide layer is deposited thereon.

Further, exhaust gas is removed through an exhaust outlet 17 by means of a vacuum pump 14 through a pressure adjusting valve 13 and a throttle valve 12. To enhance the process gas, ten low pressure mercury lamps 4, UL1-45EL2-N-1 accompanied with a power supply 5, are provided behind the nozzles 8 to radiate light with 184 nm and 354 nm in wavelength. The mercury lamps 4 are disposed in a lamp chamber 28 which is exhausted by an exhaust system and which is supplied with a small amount of nitrogen gas in order to prevent the process gas to enter into the lamp chamber. Further, the pressure in the lamp chamber 28 is kept same as that in the reaction chamber 1 by a valve 27 to avoid breach of quartz windows 26 of the lamp chamber 28. By this structure, light with 184 in wavelength is prevented from being diminished by absorption prior to entering the reaction chamber 1 from the lamps 4.

EXPERIMENT 1

The experiment was designed to demonstrate fabrication of silicon oxide from $Si_2Cl_6$ and $N_2$ in the quartz tube.

In FIG. 1, a substrate 1 was heated on the holder 22 at a substrate temperature of 300° C. by the heater 3. Dinitrogen monooxide gas was introduced into the reaction chamber 1 with the valve 7 open. Further, $Si_2Cl_6$ was introduced into the chamber 1 at the ratio 1:5 of $Si_2Cl_6$ to $N_2O$ and 300:1 of $Si_2Cl_6$ to $N_2$. The pressure in the chamber 1 was 0.1 to 100 torr, for example 10 torrs. Then a silicon oxide layer grew at 10 torrs without using a mercury sensitizer at 3.2 Å/sec by irradiating with light having 184 nm and 254 nm in wavelength. The growth rate became slow down to 2.1 Å/sec when the pressure in the chamber 1 was reduced to 3 torrs.

The layer thus formed with a thickness of 0.6 micron was identified as a silicon oxide layer by confirming the absorption line of infrared light at 1100 cm$^{-1}$. Further the inventor made an examination the layer by SIMS (Secondary Ion Mass Spectrometry). As a result, hydrogen density in the layer was less than $4\times 10^{19}$cm$^{-1}$, which is less than 1/10 of conventional figures, $2\times 10^{20}$cm$^{-1}$ to $5\times 10^{20}$cm$^{-1}$.

The reason for such a low hydrogen density can be interpreted as the following. Namely, the reaction involving $Si_2Cl_6$ and $N_2O$ also produces $Cl_2$ gas which combines hydrogens in the form of Si-H bond according to the equation,

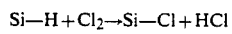

$$Si-H + Cl_2 \rightarrow Si-Cl + HCl$$

so that the bonds, Si—H, are eliminated.

Further, alkali metal ions are also removed, if any, from the layer by chloride in the same manner. Hence, the silicon oxide layer has stable characteristics according to the invention and can be used for gate insulating film.

EXPERIMENT 2

This experiment is for showing fabrication of a silicon oxide layer on a monocrystalline substrate by means of a thermal reaction. The substrate temperature was 800° C., which can be, for this experimental configuration, other temperature chosen in the range from 600° to 900° C. The chamber pressure was 2 torrs and the ratio of $Si_2Cl_6$ to $N_2O$ was 1 to 8.

In the experiment, a 1000 Å thick silicon layer was fabricated in the form of a diode with opposed electrodes. As a result, it was determined that the surface level density was less than $3\times 10^{11}$ cm$^{-1}$ and the layer exhibited hysteresis only when applied with higher than $3\times 10^4$V/cm. This result shows the scarce of charge trapping centers due to silicon clusters in the silicon oxide layer.

Accordingly, it has been confirmed that reaction involving $Si_nCl_{2n+2}$ and nitride gas is very advantageous for forming passivation film or insulating layers for insulated gate, capacitor and trenches of semiconductor devices such as MIS FETs. In the embodiments, the surface level density did not change only by less than $1\times 10^{11}$ cm$^{-2}$ even after a bias-temperature treatment with an applied voltage of $1\times 10^6$V/cm at 150° C. for five hours.

In the experiments, the combination of $Si_2Cl_6$ and $NO_2$, $NO$ or $NO_2$ is also effective as a process gas. $O_2$ gas or other oxide gas is also used in the experiment. Further, an silicon oxide layer fablicated according to the method of the initial experiment can be formed on an silicon oxide layer fabricated according to the method of the preceding experiment.

Figure 2:
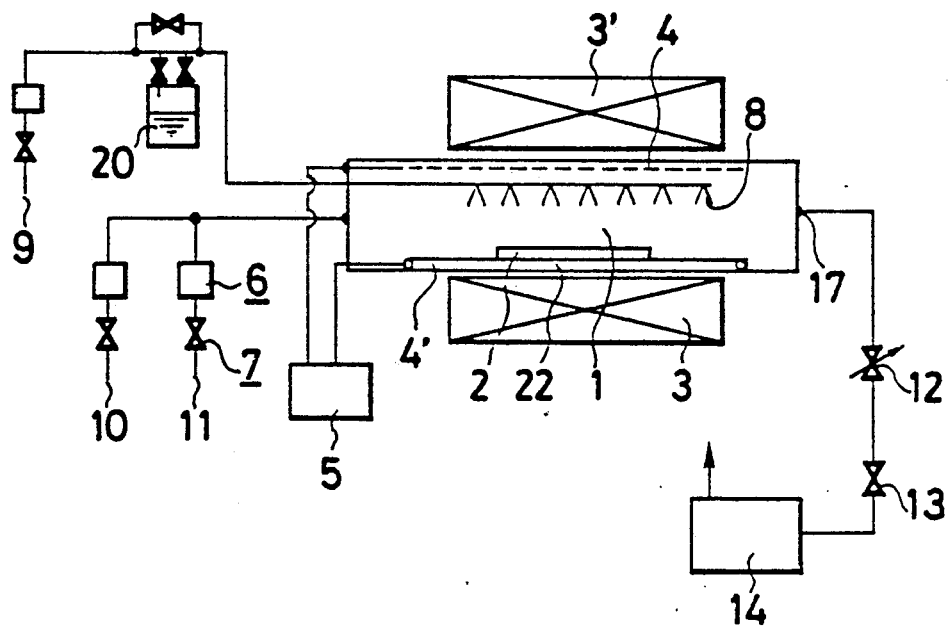
FIG. 2 is a sectional view showing another embodiment of the invention.

Referring to FIG.2, another photo CVD system according to the invention is illustrated.

In the Figure, a reaction chamber (vacuum chamber) 1 is made of quartz. A pair of electrode 4 and 4' are provided in the reaction chamber 1. A substrate 2 is mounted on the electrode 4' and heated by heaters 3 and 3' which are provided on the top and bottom of the chamber 1, at the room temperature to 900° C., preferably at the room temperature to 500° C., for example at 300° C. A doping system comprises flow meters 6, a bubbler 20 and valves 7, to which nitrogen oxide and nitrogen are supplied via lines 9 and 10 respectively. The bubbler 20 is filled with $Si_2Cl_6$, whose melting point is $-1°$ C. and whose boiling point is 144° C. The silicon hexacloride which is diluted with nitrogen gas is leaked from shower nozzles 8 toward the upper surface of the substrate 2, so that a silicon oxide layer is deposited thereon.

Further, exhaust gas is removed through an exhaust outlet 17 by means of a vacuum pump 14 through a pressure adjusting valve 13 and a throttle valve 12. To enhance the process gas, electrical energy is supplied from a electric energy supply through the pair of electrodes 4 and 4' which are separated by a distance of 1 to 5 cm, for example 1.5 cm. The electric energy is supplied at a frequency of 13.56 MHz or 50 KMHz.

EXPERIMENT 3

This experiment experiment has been made to show a fabrication process of a silicon oxide layer on a monocrystalline substrate by means of a plasma vapor reaction. The substrate temperature was 800° C., which can be, for this experimental configuration, other temperature chosen in the range from 600° to 900° C. The gaseous pressure in the chamber was 0.4 torr.

In the experiment, a 1000 Å thick silicon layer was fabricated in the form of a diode with opposed electrodes. As a result, it was determined that the surface level density was less than $3\times 10^{11}$cm$^{-1}$ and the layer exhibited hysteresis only when applied with higher than $3\times 10^4$V/cm. This result showes the scarce of charge trapping centers due to silicon clusters in the silicon oxide layer.

The layer thus formed with a thickness of 0.5 micron was identified as a silicon oxide layer by confirming the absorption spectrum of infrared light at 1100 cm$^{-1}$. Further, the inventor examined the layer by SIMS (Secondary Ion Mass Spectrometry). As a result, hydrogen density in the layer was 1 to $5\times 10^{19}$cm$^{-1}$, which is less than 1/10 of conventional figures, $2\times 10^{20}$cm$^{-1}$ to $5\times 10^{20}$cm$^{-1}$.

Although the silicon oxide layer was formed by a plasma enhanced CVD system, the resistance against the bias-temperature treatment was unexpectedly high; for example, in case the positive and negative bias field of $1\times 10^6$V/cm was applied on the layer at 150° C., the voltage across the layer is varied for 3 hours only by $\pm 0.2$ V ($Qss/Q = \mp 3\times 10^{11}$) which is less than $\frac{1}{3}$ of conventional figures according to prior art plasma CVD. Thereby the layer is recognized as a superior layer which is immune to alkali ions.

According to the invention in which $Si_2Cl_6$ is put on a chemical reaction together with mixture gas of oxygen and hydrogen or with oxide gas ($N_2$, NO or $NO_2$), oxide clusters are not formed in a deposited layer and ultraviolet light can be transmitted therethrough. Thereby, the layer is very suitable for a passivation film for EP ROM of ultraviolet erasing type.

Figure 3:
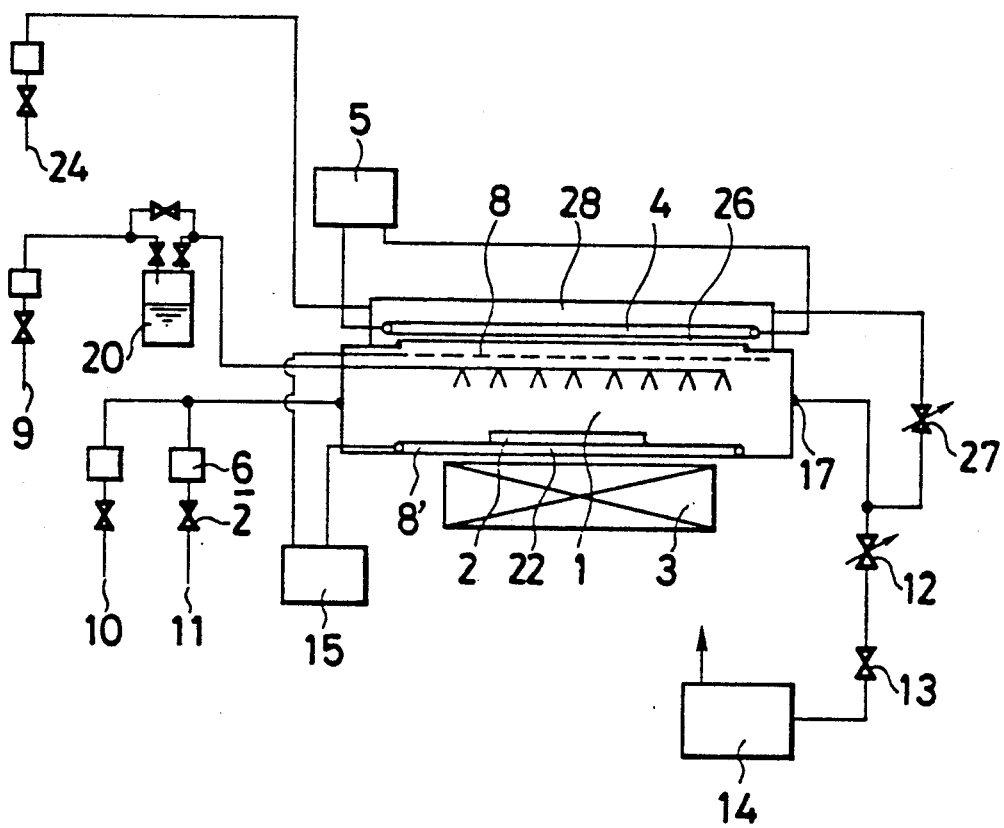

Referring to FIG. 3, a further photo or thermal enhanced CVD system according to the invention is illustrated.

In the Figure, a reaction chamber or vacuum chamber 1 is made of quartz. On a holder 22 which is heated from the bottom by a heater 3, a substrate 2 is mounted and heated at the room temperature to 1000° C., preferably at 200° to 500° C. for photoepixial growth, for example at 300° C. A doping system comprises flow meters 6, a bubbler 20 and valves 7, to which nitrogen oxide and nitrogen are supplied via lines 9 and 10 respectively. The bubbler 20 is filled with $Si_2Cl_6$ at a negative pressure.

Further, exhaust gas is removed through an exhaust outlet 17 by means of a vacuum pump 14 through a pressure adjusting valve 13 and a throttle valve 12. To enhance the process gas, ten low pressure mercury lamps 4 made of quartz, UL1-45EL2-N-1 accompanied with a power supply 5, are provided to radiate light with 184 nm and 354 nm in wavelength. The mercury lamps 4 are disposed in a lamp chamber 28 which is exhausted by an exhaust system and which is supplied with a small amount of nitrogen gas through a line 25 in order to prevent the process gas to enter into the lamp chamber. Further, the pressure in the lamp chamber 28 is kept same as that in the reaction chamber 1 by a valve 27 to avoid the quartz windows 26 to be broken of the lamp chamber 28. By this structure, light with 184 in wavelength is prevented from being absorbed by oxygen prior to entering the reaction chamber 1 from the lamps 4.

EXPERIMENT 4

According to the experiment, monocrystal semiconductor layer including silicon as the main component was formed by photochemical reaction of $Si_2Cl_6$.

In FIG.3, a substrate 1 was heated on the holder 22 at a substrate temperature of 500° C. by the heater 3. Hydorogen gas was introduced into the reaction chamber 1 with the valve 7 open. Further, $Si_2Cl_6$ was introduced into the chamber 1 at the ratio 1:10 of $Si_2Cl_6$ to $H_2$. The pressure in the chamber 1 was 0.1 to 100 torr, for example 10 torrs. Then a silicon oxide layer grew at 10 torrs without using a mercury sensitizer at 2.5 Å/sec by irradiating with light having 184 nm and 254 nm in wavelength. The growth rate became slow down to 2.0 Å/sec when the irradiation is interrupted.

Photo CVDs, especially CVDs by virtue of photoepitaxial growths, are effective particularly in the initial stage of deposition. Once the quartz window has been covered with silicon oxide, the deposition continues substantially only by means of thermal enhancement. In other words, when the thickness of the layer is more than 1000 Å, the layer is formed by two growth system, the initial stage being in accordance with photo CVD and the later being in accordance with thermal CVD.

As an electrical characteristic was obtained the resistivity of 1500 ohmcm, and only one stacking fault was observed in a field of a microscope at a 100 times magnification.

After removing the substrate on which the layer was formed, $NF_3$ gas was introduced into the reaction chamber 1 through the line 11 and the chamber 1 was let undergo plasma etching. Thus, silicon films which had been formed also on the quartz window 26 were removed from the inside of the chamber 1.

While the above description has been made for particular embodiments, many variations and modifications will be occur to those skilled in the art. In what follow, some variations are disclosed.

A nonmono-crystalline semiconductor such as an amorphous silicon layer can be deposited on a dissimilar substrate. Such semiconductor is suitable for the channel region of a thin film transistor. Further, in addition to $Si_2Cl_6$ $GeH_4$ or $GeF_4$ may be simultaneously used to obtain $SiGe_{1-x}$ ($0<x<1$) including chlorine. Also, $WSi_2$ and $MoSi_2$ respectively obtained by using $WF_6$ and $MoCl_4$.

$BF_3$ and $B_2H_6$ for p-type conductivity and $PH_3$ and $AsH_3$ for n-type conductivity may be introduced to form impurity semiconductor layers.

In place of mercury lamps, other light sources capable of radiating light with less than 300 nm in wave length such as an examiner laser (300 to 100 nm in wavelength) can be used.

To enhance the photochemical reaction, mercury exciting method can also employed by introducing mercury simultaneously into the reaction chamber. In the case, however, waste likely is contaminated by mercury and gives rise to an environment problem.

In FIGS. 1 and 3, the quartz windows 26 may be located distant from the depositing region so that photoenhancement can be carried out throughout the forming process of a layer.

Silicon chlorides which are suitable for the invention are; $H_2Si_2Cl_4$, $H_3Si_2Cl_3$, $H_4Si_2Cl_2$, $H_2Si_3Cl_6$, $H_4Si_3Cl_4$ and $H_6Si_3Cl_2$, and the substitution products thereof obtained by replacing one or more chlorine atom by a fluorine atom, which have great molar weights including at least two silicon atoms a molecule.

The present invention is also applicable to a CVD system which is enhanced only by thermal energy. In the case, depositions can be carried out such a low temperature between 500 and 1000° C. as 850° C., which is a temperature lowered by 50 to 500° C. in comparison with a conventional figure obtained by using $SiH_2Cl_2$. The present invention is further applicable to an ECR enhanced plasma CVD method using a microwave with a frequency of 2.45 GHz.

What is claimed is:

1. A method for forming a silicon oxide layer as an insulator for an insulated gate FET comprising the steps of:

disposing a substrate in a reaction chamber, keeping said substrate from room temperature to 900°C.;

introducing $Si_nX_{2n+2}$ ($n<2$) gas and oxygen of an oxide gas into said reaction chamber as a reactive gas, where X is a halogen; and supplying photo energy to said reactive gas to carry out a photo-chemical reaction, whereby a silicon oxide layer containing said halogen is deposited on said substrate, wherein alkali ions present in said silicon oxide layer are neutralized by said halogen.

2. The method according to claim 1 wherein said halogen is chlorine.

3. The method according to claim 1 wherein a doping gas selected from the group consisting of $BF_3$, $B_2H_6$, $PH_3$ and $AsH_3$ is further introduced to said reaction chamber.

4. A method for depositing a silicon oxide layer as an insulator for an insulated gate FET comprising the steps of:

disposing a substrate in a reaction chamber;

introducing $Si_nX_{2n+2}$ ($n\geq 2$) gas and oxygen or an oxide gas into said reaction chamber as a reactive gas, where X is a halogen; and supplying thermal energy to said reactive gas to carry out a thermal CVD at a substrate temperature 600°–900° C., whereby a silicon oxide layer containing said halogen is deposited on said substrate, wherein alkali ions present in said silicon oxide layer are neutralized by said halogen.

5. The method according to claim 4 wherein said halogen is chlorine.

6. The method according to claim 4 wherein a doping gas selected from the group consisting of $BF_3$, $B_2H_6$, $PH_3$ and $AsH_3$ is further introduced to said reaction chamber.

7. A method for depositing a silicon oxide layer as an insulator for an insulated gate FET comprising the steps of:

disposing a substrate in a reaction chamber;

introducing $Si_nX_{2n+2}$ ($n \geq 2$) gas and oxygen or an oxide gas into said reaction chamber as a reactive gas, where X is a halogen; and producing a plasma from said reactive gas to carry out a plasma CVD at a substrate temperature 600°–900° C., whereby a silicon oxide layer containing said halogen is deposited on said substrate, wherein alkali ions present in said silicon oxide layer are neutralized by said halogen.

8. The method according to claim 7 wherein said halogen is chlorine.

9. The method according to claim 7 wherein a doping gas selected from the group consisting of $BF_3$, $B_2H_6$, $PH_3$ and $AsH_3$ is further introduced to said reaction chamber.

* * * * *

UNITED STATES PATENT AND TRADEMARK OFFICE
CERTIFICATE OF CORRECTION

PATENT NO. : 5,037,514
DATED : August 6, 1991
INVENTOR(S) : Shunpei Yamazaki

It is certified that error appears in the above-identified patent and that said Letters Patent is hereby corrected as shown below:

Column 4, line 24, replace "800°C" with --350°C--.

Column 4, line 26, replace "600° to 900°C" with --room temperature to 500°C--.

Column 8, claim 10, line 3, replace "600°-900°C" with --from room temperature to 500°C--.

Signed and Sealed this

Second Day of March, 1993

Attest:

STEPHEN G. KUNIN

Attesting Officer

Acting Commissioner of Patents and Trademarks